US008516688B2

(12) United States Patent
Gore

(10) Patent No.: US 8,516,688 B2
(45) Date of Patent: Aug. 27, 2013

(54) ASSEMBLY

(75) Inventor: Russell Peter Gore, Abingdon (GB)

(73) Assignee: Siemens Plc., Frimley, Camberley (GB)

( * ) Notice: Subject to any disclaimer, the term of this patent is extended or adjusted under 35 U.S.C. 154(b) by 0 days.

(21) Appl. No.: 13/617,583

(22) Filed: Sep. 14, 2012

(65) Prior Publication Data

US 2013/0009734 A1 Jan. 10, 2013

Related U.S. Application Data

(63) Continuation of application No. 12/698,734, filed on Feb. 2, 2010, now Pat. No. 8,291,575.

(30) Foreign Application Priority Data

Feb. 3, 2009 (GB) .................................. 0901642.9

(51) Int. Cl.
*B23P 19/00* (2006.01)
*H01R 43/00* (2006.01)
*H05K 13/04* (2006.01)

(52) U.S. Cl.
USPC ................ 29/729; 29/602.1; 29/605; 29/606; 335/285; 335/289; 335/295

(58) Field of Classification Search
USPC ................. 29/602.1, 605, 606; 335/285–295
See application file for complete search history.

(56) References Cited

U.S. PATENT DOCUMENTS

| | | | | |
|---|---|---|---|---|
| 4,905,316 | A * | 2/1990 | Okamoto | 324/319 |
| 5,199,172 | A | 4/1993 | Runowski | |
| 5,489,848 | A | 2/1996 | Furukawa | |
| 5,567,132 | A * | 10/1996 | Dupuis et al. | 417/420 |
| 5,917,393 | A | 6/1999 | Kupiszewski et al. | |
| 7,626,477 | B2 * | 12/2009 | Huang et al. | 335/216 |
| 7,849,587 | B2 | 12/2010 | Calvert et al. | |
| 7,931,622 | B2 | 4/2011 | Beling et al. | |
| 2008/0075627 | A1 | 3/2008 | Garin et al. | |
| 2010/0280498 | A1 | 11/2010 | Olsen | |

FOREIGN PATENT DOCUMENTS

| | | | |
|---|---|---|---|
| GB | 480208 | | 12/1936 |
| GB | 2 146 569 | A | 4/1985 |
| GB | 2 176 337 | A | 12/1986 |
| GB | 2 444 508 | A | 6/2008 |
| WO | WO 2006/096045 | A1 | 9/2006 |

OTHER PUBLICATIONS

Examination Report Under Section 18(3) dated Nov. 24, 2010.

* cited by examiner

*Primary Examiner* — Paul D Kim
(74) *Attorney, Agent, or Firm* — Crowell & Moring LLP

(57) ABSTRACT

An assembly includes a cylindrical magnet assembly, which includes comprises at least one coil mounted on a former. The assembly also includes a bore tube with a number of radially-directed retaining protrusions formed in a material of the bore tube, each of the number of radially-directed retaining protrusions configured to bear against a periphery of a corresponding cavity in the former.

4 Claims, 7 Drawing Sheets

PRIOR ART

PRIOR ART

PRIOR ART

ASSEMBLY

CROSS REFERENCE TO RELATED APPLICATIONS

This application is a continuation of U.S. application Ser. No. 12/698,734, filed Feb. 2, 2010 and issued as U.S. Pat. No. 8,291,575 on Oct. 23, 2012, which claims priority under 35 U.S.C. §119 to United Kingdom Patent Application No. 0901642.9, filed Feb. 3, 2009, the entire disclosures of which are herein expressly incorporated by reference.

BACKGROUND AND SUMMARY OF THE INVENTION

The present invention relates to cylindrical superconducting magnets, and in particular to arrangements for locating such magnets within a housing. Many superconducting magnets are housed within a cryogen vessel, and are cooled by partially filling the cryogen vessel with a liquid cryogen, such as liquid helium, which boils and holds the magnet at the boiling point of the cryogen. The magnet must be firmly attached to the cryogen vessel. Other arrangements are known, in which no cryogen vessel is provided. In such arrangements, the magnet is housed within an outer vacuum container (OVC). The present invention is principally directed to arrangements for attaching a cylindrical magnet structure to a cryogen vessel.

FIGS. 1A-1B illustrate cross-sectional and axial sectional views, respectively, of a conventional cylindrical magnet arrangement for a nuclear magnetic resonance (NMR) or magnetic resonance imaging (MRI) system. A number of coils 34 of superconducting wire are wound onto a former 1 to form a cylindrical magnet structure. The resulting assembly is housed inside a cryogen vessel 2 which is at least partly filled with a liquid cryogen **2*a* at its boiling point. The coils 34 are thereby held at a temperature below the critical temperature at which they become superconductive. Commonly, the liquid cryogen 2*a* is helium, and this holds the coils 34** at a temperature of about 4K.

The former 1 is typically constructed of aluminium, which is machined to ensure accurate dimensions of the former, in turn ensuring accurate size and position of the coils on the former. Such accuracy is essential in ensuring the homogeneity and reliability of the resultant magnetic field. The formers must therefore be very rigid and firmly retained in position, relative to the bore tube 8 or cryogen vessel 2, in order to accurately locate the homogeneous imaging volume. Support protrusions 32 are typically provided on the radially inner surface of the former 1 to support the weight of the former against the bore tube 8 of the cryogen vessel, and to limit radial movement between the former and the bore tube. The remainder of the radially inner surface of the former is slightly spaced away from the radially outer surface of the bore tube 8.

The cylindrical magnet is essentially symmetrical about axis AA. References herein to “axial” and “radial” directions are determined with reference to this axis.

Also illustrated in FIGS. 1A-1B are an outer vacuum container 4 and thermal shields 3. As is well known, these serve to thermally isolate the cryogen vessel 2 from the surrounding atmosphere. Insulation 5 may be placed inside the space between the outer vacuum container and the thermal shield. The available inside diameter **4*a*** of the cylindrical magnet arrangement is required to be of a certain minimum dimension to allow patient access.

The magnet assembly, comprising the coils 34 on the former 1, needs to be securely mechanically connected to the cryogen vessel 2 to prevent rotational and axial movement in service.

FIGS. 1C-1D schematically illustrate conventional arrangements for locating a magnet former 1 firmly in position relative to a bore tube 8 of a cryogen vessel 2. This is conventionally achieved by relatively complex attachment of mechanical mounting components to the former 1, which is generally made of aluminium. The mechanical mounting components are subsequently welded to the bore tube 8 of the cryogen vessel 2. The OVC bore tube 8 and the mechanical mounting components are typically of stainless steel. Known methods for attaching the magnet former to the cryogen vessel bore tube 8 include brackets screwed to the former 1, which are then welded to the bore tube 8.

FIG. 1C shows an example of a conventional arrangement. As shown, several stainless steel brackets 80 are attached to the aluminium former 1 through holes 81 provided at suitable locations. At least one threaded hole 84 is provided into the material of the former for each bracket, and a corresponding at least one bolt 82 is screwed through a hole in bracket 80 into each threaded hole 84 to retain the bracket in position. Holes 81 are dimensioned and positioned to allow access for positioning the brackets 80 and tightening the bolts 82. In position, the brackets meet a radially outer surface of the cryogen vessel bore tube 8. The brackets are then welded 86 to the outer surface of the cryogen vessel bore tube, through holes 81. The radially inner surface of the former 1 is spaced away from the radially outer surface of the bore tube 8 by support protrusions discussed with reference to FIG. 1B. The assembly process is intricate and time-consuming. Specialist welding methods must be used, requiring highly skilled labour.

This mounting process often requires significant machining operations on the former, additional components and extended assembly time, all of which add cost to the manufacture of the cylindrical magnet, and add risk of damage. There is a general tendency for cylindrical magnets for MRI and NMR systems to be made as short as possible, and as improvements are made in this area and systems get shorter, access to suitable mounting locations gets increasingly difficult, making the assembly operation yet more difficult, costly and time-consuming. Current efforts in reducing the length of magnet systems mean that the space required for the provision of access holes 81 may not be available.

Alternatively, as illustrated in FIG. 1D, split bore tubes have been employed. The cryogen vessel bore tube 8 is formed in several pieces **8*a*, 8*b*. A backing bar 90 is provided, and the pieces 8*a*, 8*b* of the cryogen vessel bore tube are welded to the backing bar to form a complete bore tube. During assembly, the backing bar 90 is located in a recess running around a radially inner circumference of the former 1. It is held in position by spring tension. Locating pins 94 are passed through locating holes 96 provided in the former for the purpose. These locating pins 94 are typically of stainless steel and 6-10 mm diameter. About 12-24 of these pins may be placed radially around a circumference of the cryogen vessel bore tube 8. These pins will fit in the locating holes 96 tightly enough to prevent significant relative movement of the former and the bore tube in the finished structure. The pins have been shown to have a loose fit in the drawing for the purpose of illustration. The locating pins have a narrowed end 93, which fits into a corresponding receiving hole 95 in the backing bar 90. When all the locating pins have been secured to the backing bar in this manner, the backing bar is retained firmly in its position by spring tension of the backing bar acting on the various retaining pins 94. The two parts 8*a*, 8*b*** of the cryogen vessel bore tube are then aligned and introduced into the backing bar. A single weld 98 joins the retaining pins, the backing bar and the parts of the bore tube. The resulting bore tube is retained in its axial position by the locating pins 94, and is radially positioned by support protrusions 32 as discussed with reference to FIG. 1B. This latter solution has been found to be particularly complex and expensive to implement.

The invention provides methods and tools useful in securely attaching and axially locating a cylindrical superconducting magnet former 1 to a bore tube 8 of a cryogen vessel 2.

Among other objectives, the present invention seeks to reduce the labour costs involved in producing a cylindrical magnet structure comprising a cylindrical superconducting magnet former attached to a bore tube of a cryogen vessel.

The present invention accordingly provides methods, tooling and apparatus as defined in the appended claims.

BRIEF DESCRIPTION OF THE DRAWINGS

The above, and further, objects, characteristics and advantages of the present invention will become more apparent from the following description of certain embodiments thereof, given by way of non-limiting examples only, in conjunction with the accompanying drawings, wherein.

DETAILED DESCRIPTION

According to the present invention, the need for attaching mounting brackets to the former is dispensed with, along with the need to weld the brackets to the bore tube, or the provision of locating pins and their locating holes and welding inside the bore tube, as described above.

In particular embodiments, location features are formed in situ, with the magnet assembly in position relative to the bore tube 8. More specifically, in preferred embodiments of the invention, tooling is used to deform the material of the bore tube 8 into cavities or holes formed in the material of the former 1, to form retaining protrusions which hold the magnet assembly firmly in axial position, relative to the bore tube.

Using the present invention, assembly operations are simplified, resulting in significant cost and assembly time reductions for assembly of the cylindrical magnet structure. In certain embodiments of the invention, there are no additional components to attach.

Figure 1A:
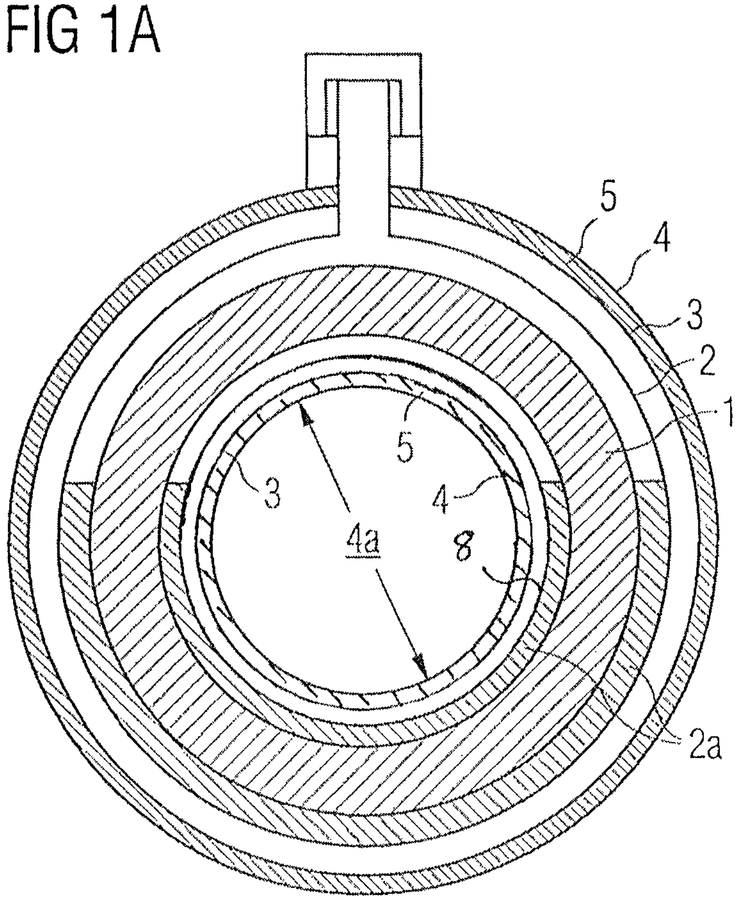
FIGS. 1A-1B illustrates cross-sectional and axial sectional views, respectively, of a conventional cylindrical magnet arrangement.
Figure 1B:
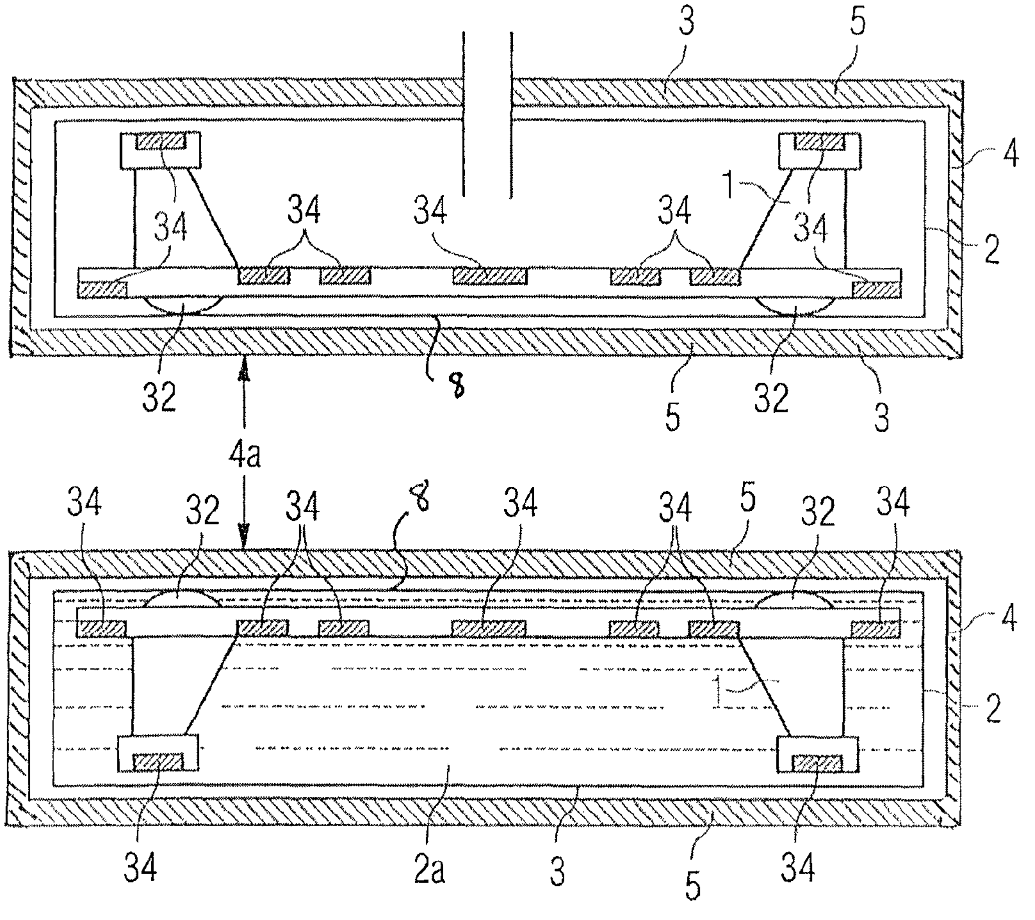
Figure 1C:
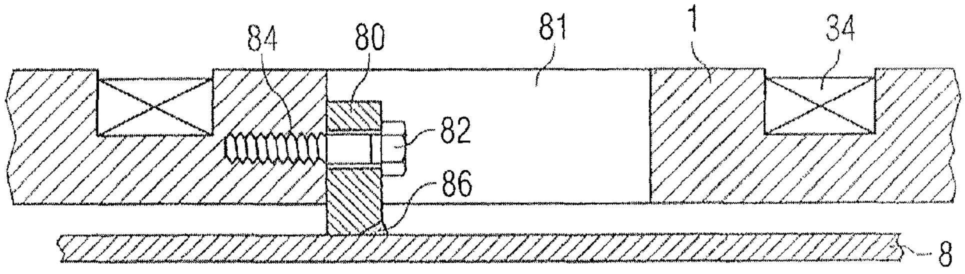
FIGS. 1C-1D schematically illustrate conventional arrangements for attaching a magnet former to a bore tube of a cryogen vessel.
Figure 1D:
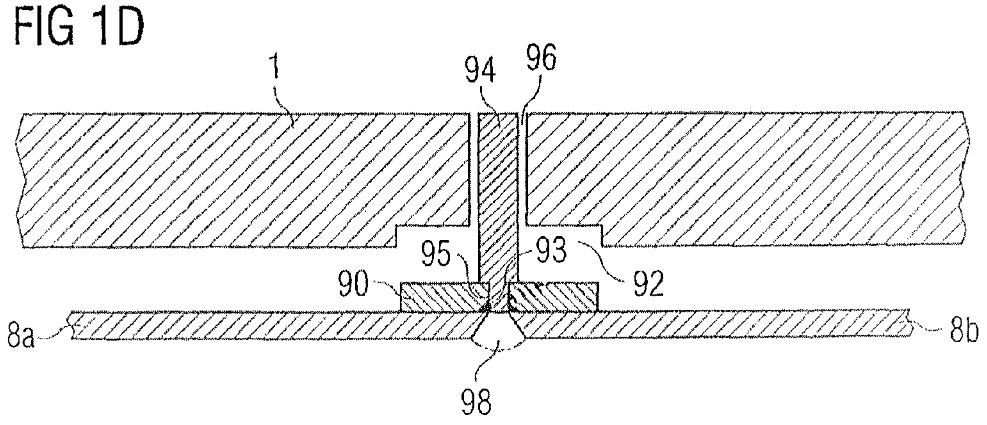
PRIOR ART FIG 1D
Figure 2A:
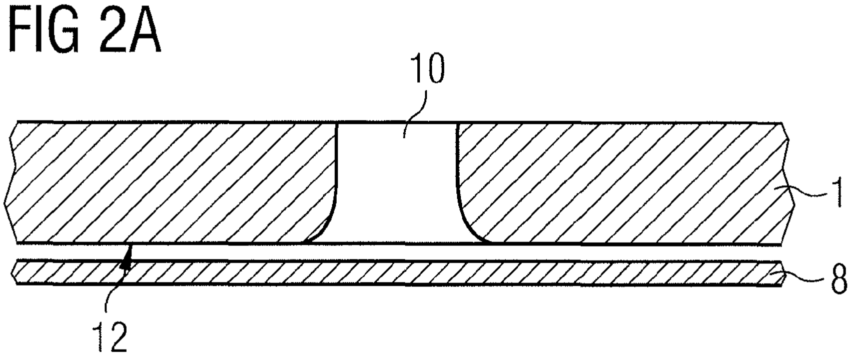
FIGS. 2A-2C represent schematic part axial cross-sections of parts of a former and a bore tube during stages of mounting the former to the bore tube, according to an example method of the present invention.
Figure 2B:
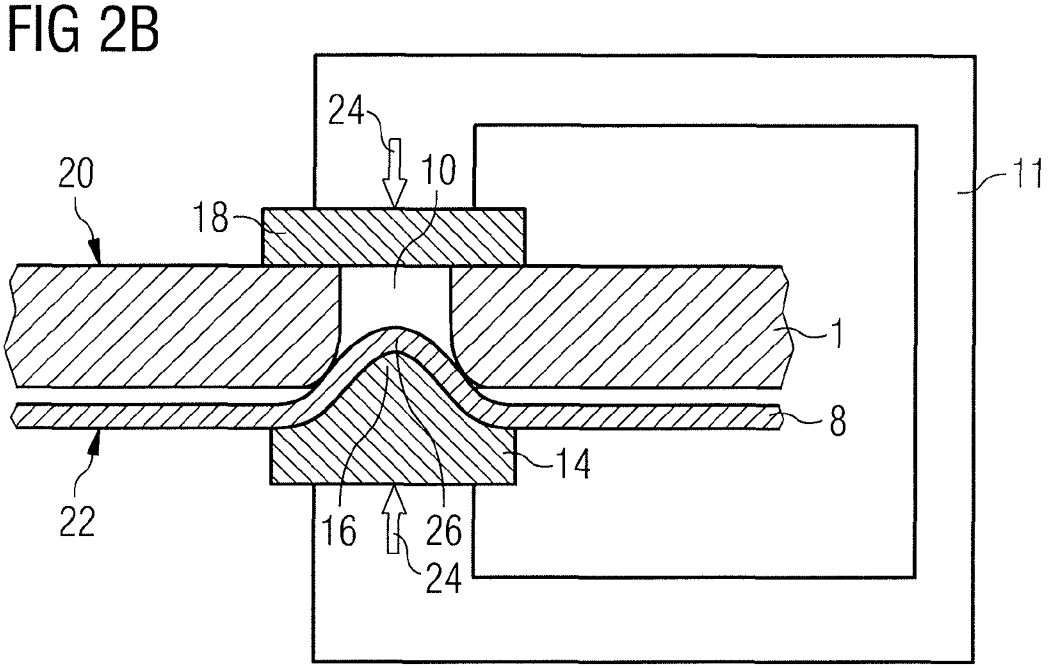
Figure 2C:
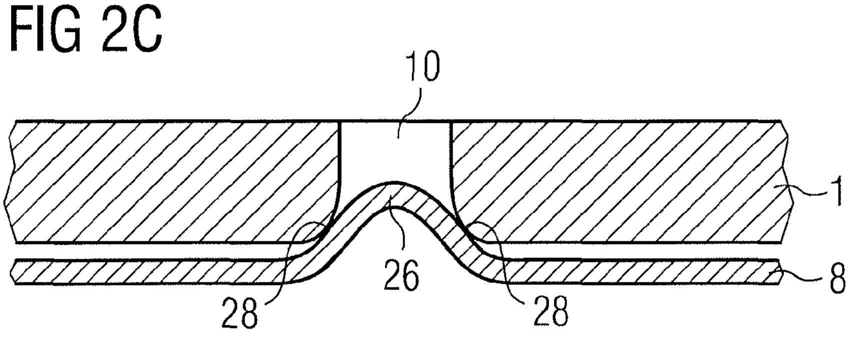

FIGS. 2A-2C represent schematic part axial cross-sections of parts of former 1 and bore tube 8 during stages of locating the former 1 to the bore tube 8, according to an example method of the present invention.

As shown in FIG. 2A, the former 1 is provided with a through-hole 10 in a position at which location to the bore tube 8 is desired.

As shown in FIG. 2B, a pressing tool 11, for example a hydraulic press, is provided. It may be introduced into the cryogen vessel 2 through an open end, or this stage of the assembly may be performed before the bore tube 8 has been assembled to other parts of the cryogen vessel 2. The tool includes a convex plate 14 carrying a shaping projection 16, and a backing plate 18 which may be essentially planar (or shaped to match the curvature of the radially outer surface 20 of the former 1), and of sufficient size to traverse the through-hole 10. The convex plate 14 is applied to the radially inner surface 22 of the bore tube 8, and the backing plate 18 is applied to the radially outer surface 20 of the former, such that the shaping projection 16 is radially aligned with the through-hole 10. The pressing tool 11 is then used to apply a mechanical force urging the convex plate and the backing plate towards one another, in the directions shown by arrows 24.

By application of sufficient force, the shaping protrusion 16 of the convex plate 14 deforms the material of the bore tube 8 into a locating protrusion 26, which is driven into hole 10 by the pressing tool 11. The hole 10 and the convex plate 14 are preferably suitably shaped and dimensioned that the plates 14, 18 reach the end of their travel as the locating protrusion 26 reaches a suitable size to extend across the full width of the hole 10 and firmly retain the former 1 in position relative to the bore tube 8.

Preferably, the hole 10 is circular, and the protrusion 16 is rotationally symmetrical about an axis which is aligned with an axis of the hole 10 during pressing.

FIG. 2C shows the resultant structure, once the pressing tool 11 has been removed. The locating protrusion 26 bears against a periphery 28 of the hole 10 in the former 1, retaining the former in position, both axially and radially, with respect to the bore tube 8.

The phenomenon known as spring-back is well known to those versed in the art of metal pressing. Although the material of the bore tube may have been deformed to the shape of the convex plate, the material will to some extent return towards its former shape when the plate is removed. The spring-back may represent a loss of typically 2-3% of the total deformation. The spring-back may cause the locating protrusion 26 to become somewhat loose in the hole 10. On cooling, aluminium, typically used as the material of the former 1, contracts more that stainless steel, the material typically used for the bore tube 8. The different in thermal contractions will tighten the fit of the locating protrusion 26 within the hole 10, compensating for the loosening of the fit caused by spring-back.

Figure 2D:
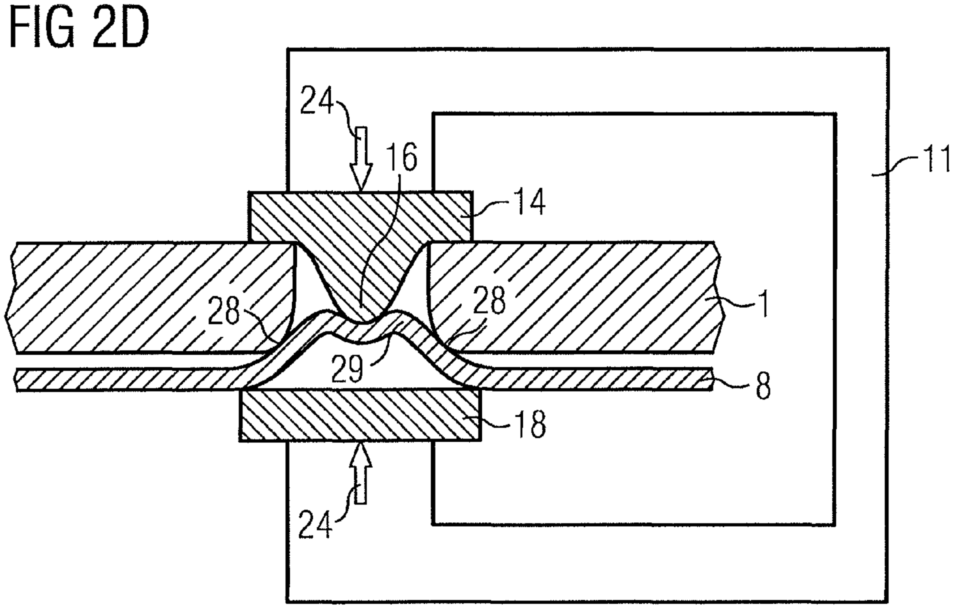
FIGS. 2D-2E show an optional further step in the process of FIGS. 2D-2E, and the result of the optional further step.

FIG. 2D shows an optional further step in the process. The pressing tool is reversed, and re-applied to the hole 10. The shaping protrusion 16 of the convex plate 14 bears against the crown of locating protrusion 26 formed previously, and deforms it at its radially outer extremity, bringing the protrusion into greater contact with the walls of the hole 10. Although there will be some spring-back from this second pressing, the result will be a tighter fit than in the absence of this optional step. A different tool may be used for this reverse pressing than was used for the first pressing.

Figure 2E:
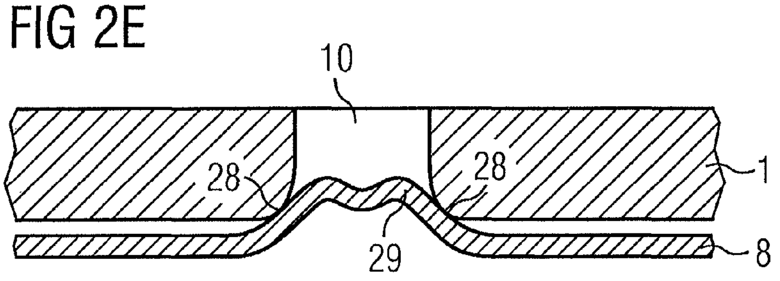

FIG. 2E shows the finished structure following the step of FIG. 2D, in which a deformed protrusion 29 bears firmly against the periphery 28 and the walls of the hole 10, retaining the former 1 firmly in position relative to the bore tube 8.

The pressing operation is similarly performed at multiple locations, distributed over the surface of the bore tube 8. As a minimum, it is expected that retaining structures such as shown in FIG. 2C or 2E would be provided in at least three locations—typically oriented at 120° intervals around a circumference of the bore tube, preferably in a common plane, perpendicular to the axis AA. Even one or two formations will provide some axial location and retention of the magnet with respect to the bore tube. Preferably, however, more will be provided, for example at least six formed equally spaced around a circumference of the bore tube. Formations may preferably be provided axially near the axial centre of the bore tube. This is preferred, as the former will be retained axially to the bore tube at the centre, and any difference in thermal contraction between the former and the bore tube will not cause the homogeneous region of the magnet to be displaced along the bore tube.

Figure 2F:
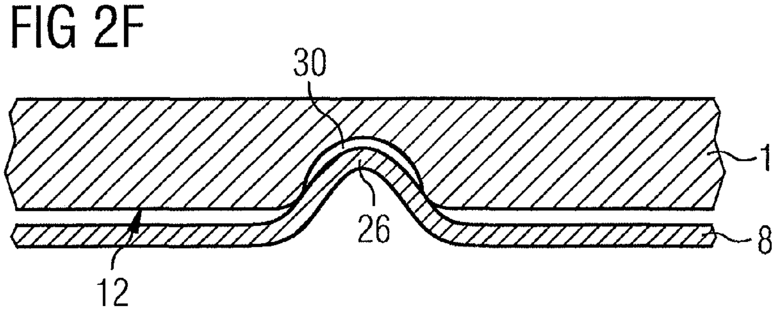
FIG. 2F represents an alternative embodiment of the present invention, produced by a method corresponding to the method shown in FIGS. 2A-2C.

In alternative embodiments, illustrated by way of example in FIG. 2F, a cavity 30 may be formed on the radially inner surface 12 of the former, without a through-hole being formed. The steps of the method are essentially the same as described with reference to FIGS. 2A-2C. The cavity 30 should be shaped and dimensioned so as not to impede formation of the retaining protrusion 26. The optional further steps described with reference to FIGS. 2D and 2E would not be available if a through-hole is not formed.

The pressing tool 11 may consist of a hydraulic actuator which drives one- or two-sided tooling into the bore tube, press forming or deep drawing the material of the bore tube 8 into a feature 26 in a cavity or hole formed in the former 1, thereby restraining the former relative to the bore tube.

The method described above, and illustrated in FIG. 2B uses a two-sided tool, having pressing plates 14, 18 which are pressed towards one another. In an alternative, one-sided tool arrangement, the bore tube 8 and former 1 are firmly held by retaining means (not illustrated), for example by being mounted to a floor. A pressing tool, comprising convex plate 14 but not backing plate 18, is firmly mounted relative to the former 1 and bore tube 8, for example by being mounted to the floor. The tool drives the convex tool radially outwards, forming a retaining protrusion 26 essentially as described above.

Due to the forces involved in forming the protrusions 26, it may be found mechanically simpler to provide a tool equipped with two oppositely-directed convex plates 14, so that two protrusions may be formed at once, and the forces required to retain the tool in position need not be provided through the mounting of the tool, but are usefully employed in forming a second retaining protrusion. Alternatively, the tool may be provided with three or more convex plates, preferably equi-angularly spaced around the circumference of the bore tube, and operating to provide a corresponding three or more retaining protrusions in the material of the bore tube.

Figure 4:
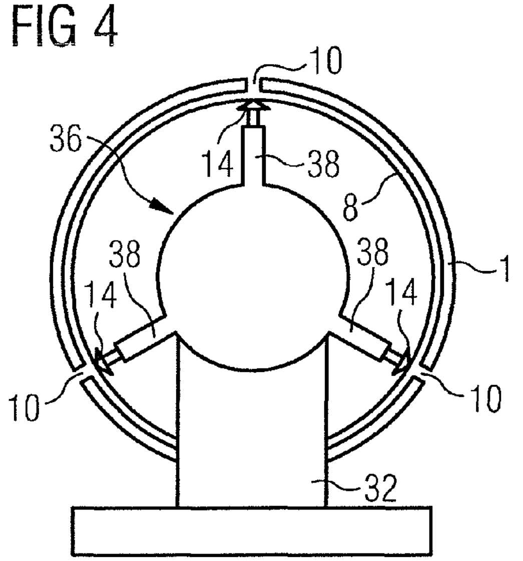
FIG. 4 represents a tool useful in methods of the present invention.

FIG. 4 shows an example of such a tool 36 in operation. From consideration of the symmetry of the forces involved, it is clear that the mounting 32 of the tool need essentially only support the weight of the tool 36, with the force required to form each retaining protrusion being offset against the force required to form the other protrusion(s). In the example tool of FIG. 4, equi-angularly spaced forming tools are positioned at predetermined locations by a suitable frame/support structure 32. The forming tools are each arranged to drive a convex plate 14 against the material of the bore tube 8 in positions corresponding to holes 10 or cavities 30 in former 1. Ideally, the three forming tools are actuated simultaneously. For example, the forming tools may be hydraulic jacks fed from a common source of hydraulic pressure such as a manual pump. Alternatively, the forming tools may be mechanical and driven by a common actuating lever, handle or wheel. The three convex plates 14 are driven radially outwards, forming retaining protrusions 26 in each of the holes 10 or cavities 30. The pressure is then removed, and the convex plates 14 moved radially inwards, freeing the tool 36 to be removed, or moved to another location for use in forming further retaining protrusions.

In another arrangement according to the invention, separate convex and concave tools may be provided, and then driven towards one another to produce retaining protrusions according to the present invention. For example, it may be preferred to create the location features at or near the axial mid point of the bore tube. As the magnet and cryogen vessel are cooled from ambient temperature, an aluminium magnet former 1 will shrink more than a stainless steel cryogen vessel bore tube 8. If the location features are axially located near one end of the bore tube, the magnetic centre may move axially by 2-3 mm during cooling.

It may be impractical to provide a 'clamp' type tool, such as illustrated in FIGS. 2B and 2D capable of reaching near to the axial mid-point of the bore tube and capable of generating sufficient pressure at that position, as it would require a yoke which is very heavy and unwieldy. As an alternative, a central (convex) tool structure may be provided within the bore, and an external frame supporting a concave tool separately. Arrangements must be made for aligning the tools to a sufficient accuracy.

Figure 5:
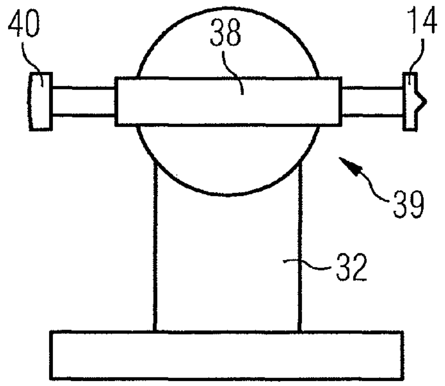
FIG. 5 represents another tool useful in methods of the present invention.

FIG. 5 shows an alternative tool 39 suitable for use in the methods of the present invention. This tool is operable to form a single retaining protrusion at a time. A forming tool, such as a hydraulic jack, 38 operates to drive a convex plate 14 away from a bracing plate 40. This may be by driving one or other plate away from the body of the forming tool, or by driving both away from the body of the forming tool. In use, the convex plate 14 is placed against the material of the bore tube 8 in a position corresponding to a hole 10 or cavity 30 in former 1. The bracing plate 40 is placed against the material of the bore tube 8 diametrically opposite the hole 10 or cavity. The forming tool is then activated, to drive the convex plate and the bracing plate further apart. The convex plate deforms the material of the bore tube 8 to form a retaining protrusion 26 as described above. If it is desired to form retaining protrusions diametrically opposite one another, the bracing plate 40 is replaced by a second convex plate 14, allowing two retaining protrusions to be formed at a time, by operating the forming tool 38 to drive the two convex plates away from each other. The tool 39 may be manually positioned, or may be mounted on a mounting 32. Preferably, a mounting is used and arranged such that both plates 14, 40 are driven away from the forming tool, so that the forming tool remains central to the bore tube, in use.

Figure 3A:
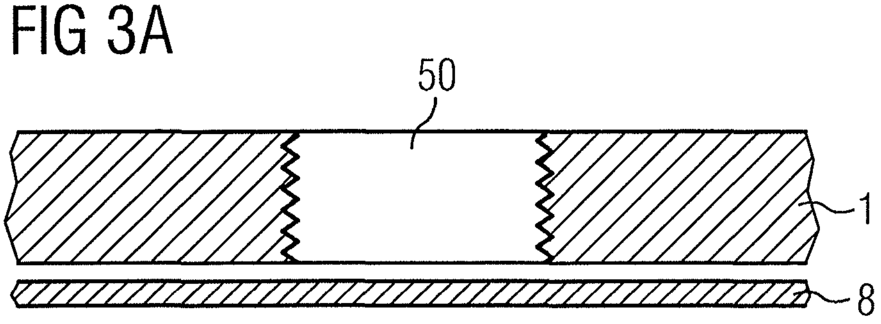
FIGS. 3A-3C represent schematic part axial cross-sections of parts of a former and a bore tube during stages of mounting the former to the bore tube, according to another example method of the present invention.
Figure 3B:
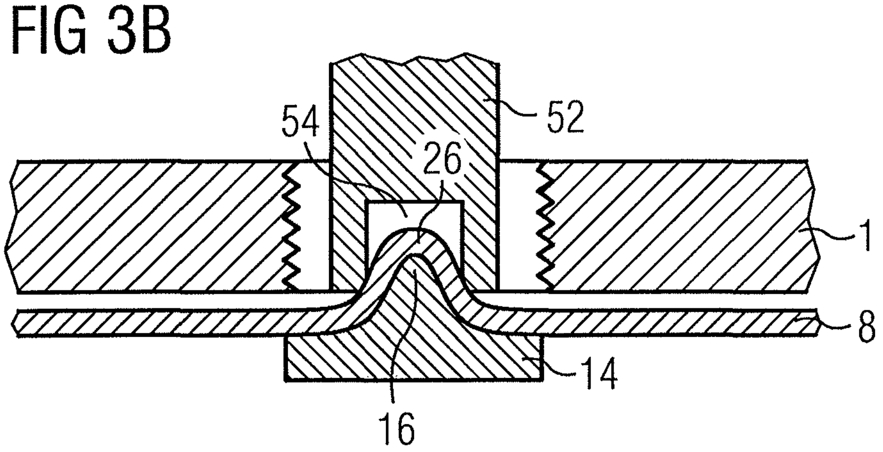
Figure 3C:
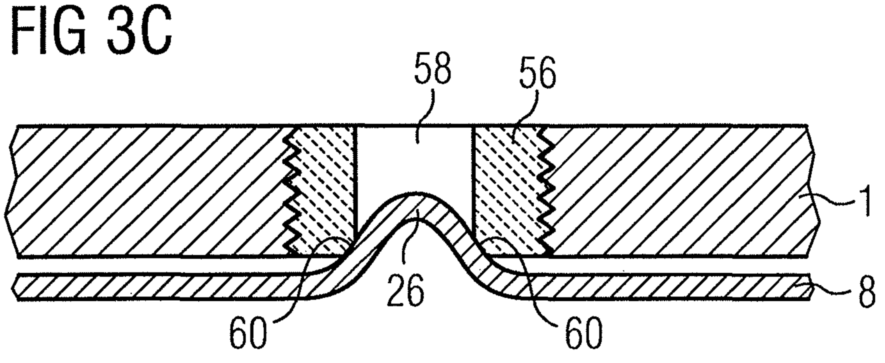

FIGS. 3A-3C show schematic partial axial cross sections of the bore tube 8 and the former 1 at certain stages of the mounting process according to another embodiment of the present invention.

As shown in FIG. 3A, the former 1 is provided with threaded holes 50 rather than the plain holes 10 of FIGS. 2A-2C.

FIG. 3B shows a view, corresponding to FIG. 2B, of a pressing tool 11 acting on the material of the bore tube 8 to form a retaining protrusion. The tool itself is not shown in FIG. 3B. A convex plate 14 is brought into contact with the radially inner surface of the bore tube 8, while a concave tool 52 is brought into contact with the radially outer surface of the bore tube, through threaded hole 50, such that its cavity 54 is in alignment with the shaping protrusion 16 of the convex plate.

The tool then drives the convex plate 14 and the concave tool 52 into closer proximity. By application of sufficient force, the shaping protrusion 16 of the convex plate 14 deforms the material of the bore tube 8 into a locating protrusion 26, which is driven into cavity 54 of the concave tool 52 by the pressing tool. The concave tool 52 and the convex plate 14 reach the end of their travel as the locating protrusion 26 is formed.

Preferably, the hole 10 is circular, and the protrusion 16 is rotationally symmetrical about an axis which is aligned with an axis of the hole 50 during pressing.

According to this embodiment of the invention, the hole 50 is of greater radius than the formed retaining protrusion 26. A threaded insert 56 is screwed into the hole 50 to bear against the retaining protrusion 26. Preferably, the threaded insert 56 has an axial through-hole 58, into which the retaining protrusion partially protrudes as the treaded insert is tightened.

Similar structures may be formed at several points axially and circumferentially as required over the surface of the bore tube 8. By adjusting the position of the threaded inserts, alignment between the bore tube 8 and the former 1 may be adjusted, if required. Once the threaded inserts are in the correct position, they may be locked in position by soldering, brazing, welding, gluing and so on, depending on the materials used for the former and the inserts. Furthermore, the use of the threaded inserts removes the risk that a retaining protrusion may not adequately bear against the periphery 28 or walls of a hole, as the insert may be tightened to ensure suitable interaction with the retaining protrusion 26. This action may be used to compensate for spring-back of the retaining protrusion, as the insert may be used to ensure an appropriate bearing force between the former and the bore tube.

The radially outer extremity of the threaded insert is provided with a driving formation for engaging a tightening tool, such as a screwdriver, spanner, hex wrench (Allen key), Torx® driver and so on.

As illustrated in FIG. 3C, the periphery 60 of the hole 58 in the threaded insert 56 may be shaped, for example chamfered, to provide a larger contact area between the insert 56 and the protrusion 26.

In alternative arrangements, the threaded insert 56 may be provided with a cavity for receiving the retaining protrusion 26, rather than a through-hole 58. The threaded insert 56 may be replaced with alternative fittings, for example an insert with a bayonet-type fitting; a plug with mounting screws which are screwed into the material of the former adjacent the hole 50; plain inserts which are driven into the hole 50 by a mechanical operation, for example using a jack, and are then glued, welded, brazed, soldered or otherwise attached in position, or a spring-loaded insert which grips the sides of the hole 50 when pressed in. For many of these embodiments, it is not necessary that the hole 50 be threaded.

Considering again the operation of FIGS. 2A-2B, it may be found that the forces required to deform a stainless steel bore tube 8 into the hole 10 of an aluminium former 8 may be sufficient to deform the material of the former, particularly near the edge of the hole. In alternative embodiments, an insert 56 such as shown in FIG. 3C, or any equivalent type of insert discussed above, may be provided in the former, and the bore tube then deformed in the manner shown in FIGS. 2A-2B into a cavity within the insert, to form a structure as shown in FIG. 3C.

Figure 6:
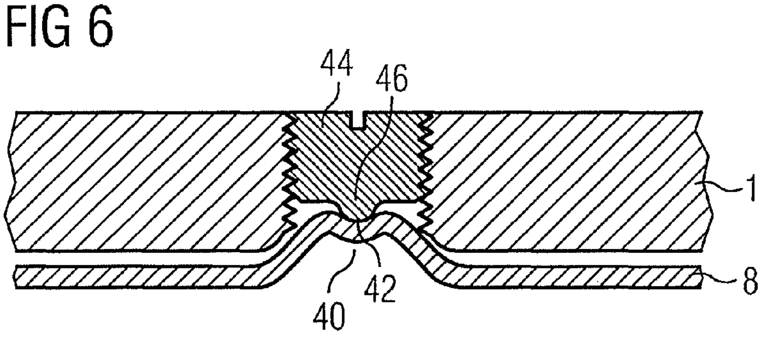
FIGS. 6-7 represent mounting points according to further embodiments of the present invention.
Figure 7:
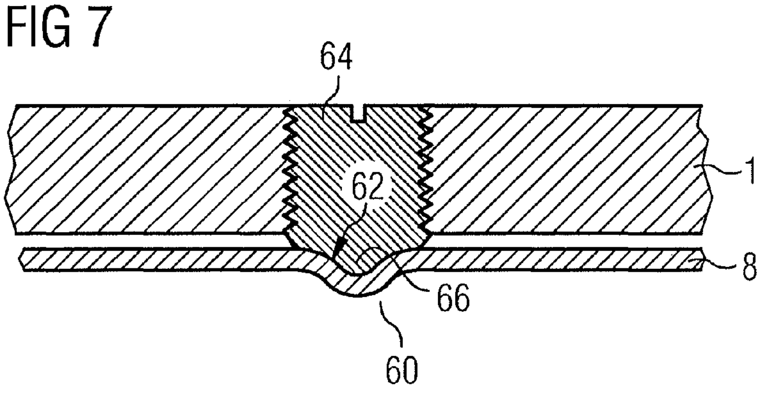

FIGS. 6 and 7 show partial axial cross-sections of further embodiments of the present invention.

With reference to FIG. 6, the pressing operation illustrated in FIG. 3B may be followed by another pressing operation, similar to that of FIG. 2D, in which a convex plate is pressed onto the radially outer extremity (crown) of the protrusion 26, to form a deformed protrusion 40, having a dished radially outer extremity 42. Threaded insert 44 has a convex radially inner extremity 46 which, as the threaded insert is tightened, bears on the material of the bore tube 8 in the dished radially outer extremity. Such embodiments may be advantageous in requiring simpler threaded inserts 44, similar to a common grub screw. The threaded insert 44 may be replaced with alternative fittings, for example an insert with a bayonet-type fitting; a plug with mounting screws which are screwed into the material of the former adjacent the hole 50; plain inserts which are driven into the hole 50 by a mechanical operation, for example using a jack, and are then glued, welded, brazed, soldered or otherwise attached in position, or a spring-loaded insert which grips the sides of the hole 50 when pressed in. For many of these embodiments, it is not necessary that the hole 50 be threaded.

With reference to FIG. 7, the pressing operation illustrated in FIG. 3B is inverted, so that the retaining protrusion 60 extends radially inwards. A concave radially outer surface 62 of the protrusion is aligned with hole 50. Threaded insert 64 has a convex radially inner extremity 66 which, as the threaded insert is tightened, bears on the material of the bore tube 8 in the concave radially outer surface 62 of the protrusion. Such embodiments may be advantageous in requiring simpler threaded inserts 64, similar to a common grub screw, but may have disadvantages in that the clear inner diameter of the bore tube 8 is reduced by the dimensions of the protrusions 60. The threaded insert 64 may be replaced with alternative fittings, for example an insert with a bayonet-type fitting; a plug with mounting screws which are screwed into the material of the former adjacent the hole 50; plain inserts which are driven into the hole 50 by a mechanical operation, for example using a jack, and are then glued, welded, brazed, soldered or otherwise attached in position, or a spring-loaded insert which grips the sides of the hole 50 when pressed in. For many of these embodiments, it is not necessary that the hole 50 be threaded.

Embodiments such as illustrated in FIG. 7 may be used by forming the protrusions 60 in the material of the bore tube before it is placed inside the former 1. The locations of the protrusions formed in the material of the bore tube 8 must be arranged to align with the positions of the threaded inserts 64 or equivalent. Once the protrusions are formed in the bore tube 8, it is slid into the former, and the threaded inserts 64 or equivalent moved into position to axially retain the former relative to the bore tube.

Typically, an aluminium former 1 is secured to a stainless steel bore tube 8. The differential thermal contraction encountered during service, when the former and the bore tube are cooled to a cryogenic temperature for example of 4K, will naturally tighten the joint and improve location accuracy between the former and the bore tube.

While the present invention has been described with reference to certain exemplary embodiments, numerous modifications and variations of the invention will be apparent to those skilled in the art, within the scope of the appended claims.

The present invention provides methods and tooling for assembling magnet structures to bore tubes, and such assembled structures, in which no welding steps are required, assembly is rapid and simple, and no holes need be made in the bore tube. Typically, the bore tubes in question are bore tubes of a cryogen vessel, but the present invention may be applied to the location of magnet structures with respect to other types of bore tube.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. An assembly comprising:

a cylindrical magnet assembly, which comprises at least one coil mounted on a former; and a bore tube that includes a number of radially-directed retaining protrusions formed in a material of the bore tube, each of the number of radially-directed retaining protrusions configured to bear against a periphery of a corresponding cavity in the former.

2. The assembly according to claim 1, wherein at least one cavity is provided within an insert, located within a hole in the former, and the corresponding protrusion bears against the insert.

3. The assembly according to claim 1, wherein at least one cavity is a through-hole in the material of the former.

4. The assembly according to claim 1, wherein one of the number of the retaining protrusions is radially outwardly directed and has a deformation at its radially outer extremity to bear against the periphery and walls of the cavity in the former.

* * * * *